United States Patent [19]

Seio et al.

[11] Patent Number: 5,166,036
[45] Date of Patent: Nov. 24, 1992

[54] ELECTRODEPOSITION COATING COMPOSITION AND IMAGE-FORMING METHOD USING THE SAME

[75] Inventors: Mamoru Seio; Takeshi Ikeda; Kanji Nishijima, all of Osaka; Katsukiyo Ishikawa, Kyoto, all of Japan

[73] Assignee: Nippon Paint Co., Ltd., Osaka, Japan

[21] Appl. No.: 727,523

[22] Filed: Jul. 9, 1991

Related U.S. Application Data

[62] Division of Ser. No. 388,471, Aug. 2, 1989, Pat. No. 5,055,374.

[30] Foreign Application Priority Data

Aug. 2, 1988 [JP] Japan .................................. 63-193248

[51] Int. Cl.$^5$ ........................ G03F 7/16; G03F 7/023
[52] U.S. Cl. .................... 430/313; 430/165;
430/168; 430/169; 430/190; 430/192; 430/193;
430/318; 430/323; 430/326; 430/329; 430/935;
204/181.6; 204/181.7
[58] Field of Search ............... 430/192, 193, 190, 168,
430/169, 326, 323, 165, 329, 935, 313, 319, 318;
204/181.7, 181.6

[56] References Cited

U.S. PATENT DOCUMENTS

| | | | |
|---|---|---|---|
| 3,890,153 | 6/1975 | Dijkstra et al. | 430/165 |
| 4,339,368 | 7/1982 | Tsou | 523/414 |
| 4,592,816 | 6/1986 | Emmons et al. | 204/180.6 |
| 4,632,900 | 12/1986 | Demmer et al. | 430/323 |
| 4,673,458 | 6/1987 | Ishikawa et al. | 430/313 |
| 4,812,549 | 3/1989 | Muramoto et al. | 526/318 |
| 4,946,757 | 8/1990 | Seio et al. | 430/192 |
| 4,999,274 | 3/1991 | Seio et al. | 430/326 |

FOREIGN PATENT DOCUMENTS

| | | |
|---|---|---|
| 0301101 | 2/1989 | European Pat. Off. . |
| 0302941 | 2/1989 | European Pat. Off. . |
| 60-207139 | 10/1985 | Japan . |
| 61-218616 | 9/1986 | Japan . |
| 61-247090 | 11/1986 | Japan . |
| 62-262855 | 11/1987 | Japan . |
| 62-262856 | 11/1987 | Japan . |

OTHER PUBLICATIONS

Research Disclosure, Jun. 1973, No. 11020, pp. 65-70.

*Primary Examiner*—Marion E. McCamish
*Assistant Examiner*—Janis L. Dote
*Attorney, Agent, or Firm*—Wenderoth, Lind & Ponack

[57] ABSTRACT

The invention provides an aqueous electrodeposition coating composition for a positive working resist and an image-forming method using the same. The coating composition is very stable under storage conditions and is capable of resulting in a positive working resist which is specifically useful in the preparation of a printed circuit board with mini-via-holes.

1 Claim, No Drawings

ELECTRODEPOSITION COATING COMPOSITION AND IMAGE-FORMING METHOD USING THE SAME

This application is a division of Ser. No. 388,417 filed Aug. 2, 1989, now U.S. Pat. No. 5,055,374.

FIELD OF THE INVENTION

The present invention relates to an electrodeposition coating composition for a positive working resist and to an image-forming method comprising forming on a conductive layer on an insulation substrate a positive working resist layer by the adoption of an electrodeposition with the abovementioned coating composition and exposing the resist layer, through a circuit pattern mask placed on the layer, to an actinic light, developing the same to remove the exposed area of the resist, subjecting it to etching to remove the conductive layer located at the exposed area and finally removing the resist still remaining at the unexposed area.

BACKGROUND OF THE INVENTION

Recently, with the increasing demands for miniaturization, weight reduction, multifunctionalization and speed-up of electronic devices, highly accumulated, micronized electronic parts are required in quantity and at the same time, demands for highly dense, reliable printed circuit boards are increasing day by day. In the preparation of a printed circuit board, a method has been used wherein a resist film pattern corresponding to the desired circuit is formed on a copper layer on an insulation substrate either by a direct printing or a combination of steps of applying on the copper layer a photosensitive resin coating, exposing the coating, through a circuit pattern mask placed thereon, to an actinic light and developing the same, and subjecting the thus obtained plate having the resist film pattern thereon to an etching to obtain the desired copper circuit pattern. At the present day, as a pattern forming method, either of such screen printing method and photographic method with a dry film are generally used. However, both methods have several problems with respect to fineness and productivity. More specifically, in a screen printing method, it is hardly possible to have a fine pattern, and in a dry film photographic method, there are problems of poor adhesion to copper, inferior coverage for irregular plate surface derived from uneven polishing and the like. Therefore, conventional coating methods of using a liquid resist material by dipping, roller coating, rotary coating and spray coating are now being considered again. However, there still remains problems in respect of uneveness of the formed coating, pinholes, uneven coating thickness and the like.

For the image-formation on both surfaces of a substrate or a multi-layered plate, a substrate having through-holes previously coated with copper by an electroless plating or electroplating is usually used. During an etching operation, said copper coat on the through-hole surface must be fully protected for securing the roles of such through-hole as electronic parts insertion hole and electric conduction passage. For this purpose, the so-called tenting method in which the through-holes are covered by a dry-film or hole-filling method in which the through-holes are previously filled with a resist material is heretofore used prior to the formation of a resist pattern with a liquid resist composition. Among them, the tenting method is most widely used because of the least number of operational steps. However, this cannot give satisfactory results with a substrate having a number of mini-via-holes with very narrow lands.

To cope with the same, an electrodeposition coating method now becomes the object of public attention. Heretofore proposed photosensitive resin compositions for resist film are classified into two groups, i.e. one is a negative type photosensitive resin composition (the so-called photocuring type photosensitive resin composition) and the other is a positive type photosensitive resin composition (the so-called photosolubilizing type photosensitive resin composition). When the former is used for the formation of photosensitive resist film, thus obtained resist film is photocured at the exposed area and unexposed portions are subsequently removed off by an appropriate solvent in a developing step, thereby leaving the photocured resist corresponding to the desired circuit pattern. Such methods and materials are disclosed in many publications as, for example, Japanese Patent Publication (unexamined) Nos. 247090/86, 262855/87, 262856/87, U.S. Pat. No. 4,592,816 and the like. The materials disclosed, in general, contain, as main ingredients, a saturated or unsaturated polymer containing ionic groups, a photopolymerization initiator and optional unsaturated monomers. Such materials show good adhesion toward copper coating, exhibit higher coverage for uneven surface due to their slowing power properties and can be applied automatically and on continuous basis, without the necessity for using expensive installation devices and excessive man power.

However, in order to obtain a good film which is well resistive toward the actions from a developer and an etching solution, in a possible short exposure time, it is generally required to add a liquid or semi-solid unsaturated monomer. This will, in turn, result in a tacky coating. Therefore, when a circuit pattern mask is placed on the resist film and the composite is exposed to an actinic light, undesired adhesion of uncured resin to the mask often occurs and repeating use of the same mask is interrupted. In this process, it is, therefore, required to provide an adhesion proof layer on the formed resist film and hence, the process is uneconomical. Furthermore, for a better etching resist, the applied resin must be photocured even at a narrow inner surface of the through-hole. Nevertheless, for mini-via-holes with considerably large aspect ratio, a longer exposure time is required for the desired photocuring. Therefore, if the exposure time agrees with the time required for the photocuring of the resin located at the inside of narrow through-holes, excessive photocuring occurs at the plane resist surface, causing image gain of the resist pattern. Moreover, it is almost impossible to cause an effective photocuring at the inside of through-holes having an average diameter of 0.3 mm or less.

In contrast thereto, a positive type photosensitive resin composition is totally free from the abovementioned problems. Examples of such positive type photosensitive resin compositions for electrodeposition coating are aqueous dispersion of phenolic novolac resin having in its phenol nucleus both a quinonediazido group and a hydrophilic ionic group as disclosed in Japanese Patent Publication (unexamined) No. 207139/85, and aqueous dispersion of modified phenol resin having both a quinonediazido group and an acidic group as disclosed in Japanese Patent Publication (unexamined) No. 218616/86. Such compositions are useful in the electrodeposition coating for complicated structural materials as a circuit board with through-holes, and are capable of forming a uniform coating with good adhesion toward copper. However, when applied in a thin layer, occurrence of pinholes in the formed coating is unavoidable due to the generation of gas through an electrode reaction. Since the phenolic novolac resin is brittle by nature and has inferior thermal flowability, restoration of the pinhole area is very difficult to do. Therefore, many defects often occur in the circuit pattern and hence such compositions are inadequate for the resist film to be used in the formation of fine circuit pattern.

The inventors have previously proposed, under the circumstances, a positive type photosensitive resin composition comprising a quinone diazido compound and an acrylic resin bearing at least one side chain having the structure of

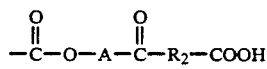 (a)

wherein $R_2$ is a substituted or unsubstituted hydrocarbon residue selected from aliphatic hydrocarbons having 2 to 10 carbon atoms, alicyclic hydrocarbons having 6 to 7 carbon atoms and aromatic hydrocarbons having 6 carbon atoms; A is a repeating unit of the formula:

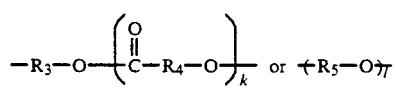

(in which $R_3$ is ethylene or propylene; $R_4$ is a substituted or unsubstituted alkylene having 2 to 7 carbon atoms; $R_5$ is a substituted or unsubstituted alkylene having 2 to 5 carbon atoms; k and l each represents an average repeating unit number and k is 1 to 10 and l is 2 to 50); or

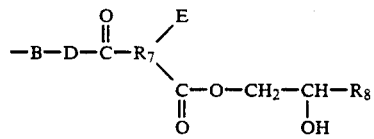 (b)

wherein $R_7$ is a substituted or unsubstituted hydrocarbon residue selected from aliphatic hydrocarbons having 5 to 10 carbon atoms, alicyclic hydrocarbons having 6 to 7 carbon atoms and aromatic hydrocarbons having 6 to 13 carbon atoms; $R_8$ is selected from aliphatic hydrocarbons having 1 to 30 carbon atoms or aromatic hydrocarbons having 6 to 13 carbon atoms optionally substituted with any one of a vinyl group, allyl group, ether group, ester group, and carbonyl group, each singularly or in combination of two or more in the main chain, and optionally substituted in the side chain(s); B is a

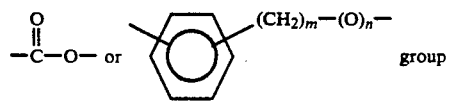

(in which m and n each is 0 or 1); D is a repeating unit of the formula:

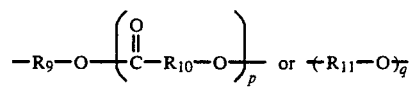

(in which $R_9$ is ethylene or propylene; $R_{10}$ is a substituted or unsubstituted alkylene having 2 to 7 carbon atoms; $R_{11}$ is a substituted or unsubstituted alkylene having 2 to 5 carbon atoms; p and q each is an average repeating unit number and p is 1 to 10 and q is 2 to 50), and E is a carboxylic acid, sulfonic acid, phosphoric acid or phosphorus acid group., (PCT/JP88/00093, filed Sep. 30, 1988; EP Appln. 88 901 323.1, published Feb. 1, 1989 as A1 0301101). The present inventors have also previously proposed a positive type photosensitive resin composition comprising a resin obtained by the reaction of (a) at least one polyepoxide compound having an epoxy equivalent of 75 to 1,000, selected from the group consisting of polyvalent alcohol glycidyl ester compound, polycarboxylic acid glycidyl ester compound, alicyclic glycidyl compound, glycidyl amine compound, heterocyclic glycidyl compound and bisphenol-A alkylene oxide compound, with (b) aromatic or heterocyclic carboxylic acid bearing phenolic hydroxyl groups represented by the formula:

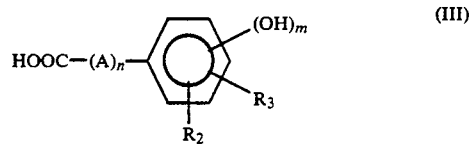 (III)

in which A is a substituted or unsubstituted alkylene or arylene, or

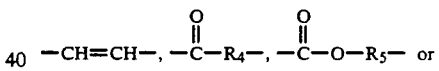 or

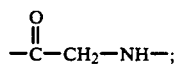

$R_4$ and $R_5$ each represents a substituted or unsubstituted alkylene or arylene; n is 0 or 1; m is an integer of 1 to 3; $R_2$ and $R_3$ each represents hydrogen, halogen, alkyl, alkenyl, nitro or alkoxy group, and $R_2$ and $R_3$, taken together with carbon atoms of the benzene ring may form an aromatic, alicyclic or heterocyclic ring, and (c) 1,2-quinonediazido sulfonic acid halide, in the ratio, in terms of equivalent ratio, of carboxyl group of said (d): epoxy group of said (c)=1:0.8 to 1.2 and phenolic hydroxyl group of said (d): sulfonyl halide group of said (e)=1:0.05 to 1.2, (PCT/JP88/00094, filed Feb. 2, 1988; EP Application 88901324.9, published Feb. 15, 1989 as A₁ 0302941).

These compositions are excellent because they result in coatings with excellent flexibility and adhesion, whose unexposed area will give the least swelling at the development stage. However, there still remains a question of the stability of a sensitive group of the compositions.

It is therefore, an object of the invention to provide a positive type photosensitive resin composition which is excellent in storage stability of the photosensitive group, is capable of resulting in a coating, by electrodeposition means on various base plates, with excellent flexibility and adhesion to copper, the coating being free, even in a thin layer, from pinholes and highly sensitive, excellent in alkaline development and affording the least undesired swelling, if not exposed, at the developing stage and hence specifically useful as a resist for the formation of a fine circuit pattern. It is an additional object of the invention to provide an image-forming method specifically useful for the formation of a fine circuit pattern with a substrate having mini-via-holes.

SUMMARY OF THE INVENTION

According to the invention, the aforesaid objects can be advantageously attained with an aqueous electrodeposition coating composition for positive working resist comprising (A) an acrylic resin obtained by the copolymerization of
  (a) 3 to 80% by weight of an acid group bearing long-chain monomer represented by the formula:

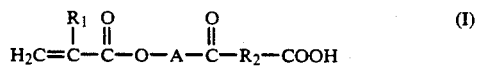

or the formula:

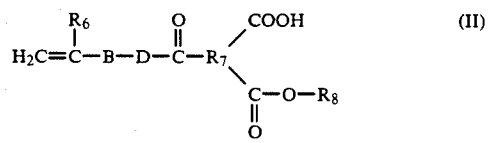

wherein $R_1$ and $R_6$ each represents hydrogen or methyl; $R_2$ is a substituted or unsubstituted hydrocarbon residue selected from aliphatic hydrocarbons having 2 to 10 carbon atoms, alicyclic hydrocarbons having 6 to 7 carbon atoms and aromatic hydrocarbons having 6 carbon atoms; A is a repeating unit of the formula:

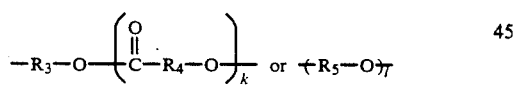

(in which $R_3$ is ethylene or propylene; $R_4$ is a substituted or unsubstituted alkylene having 2 to 7 carbon atoms; $R_5$ is a substituted or unsubstituted alkylene having 2 to 5 carbon atoms; k and l each represents an average repeating unit number and k is 1 to 10 and l is 2 to 50); $R_7$ is a substituted or unsubstituted hydrocarbon residue selected from aliphatic hydrocarbons having 5 to 10 carbon atoms, alicyclic hydrocarbons having 6 to 7 carbon atoms and aromatic hydrocarbons having 6 to 13 carbon atoms; $R_8$ is selected from aliphatic hydrocarbons having 1 to 30 carbon atoms and aromatic hydrocarbons having 6 to 13 carbon atoms whose main chain may include at least one of vinyl group, allyl group, ether group, ester group, carbonyl group, hydroxyl group and combination thereof and whose side chain may include substituents; B is a

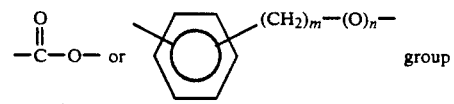

group (in which m and n each is 0 or 1); D is a repeating unit of the formula:

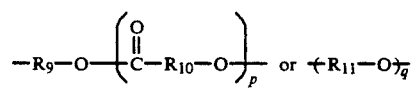

(in which $R_9$ is ethylene or propylene; $R_{10}$ is a substituted or unsubstituted alkylene having 2 to 7 carbon atoms; $R_{11}$ is a substituted or unsubstituted alkylene having 2 to 5 carbon atoms; p and q each is an average repeating unit number and p is 1 to 10 and q is 2 to 50), and (b) 97 to 20% by weight of another copolymerizable α,β-ethylenically unsaturated compound, the weight average molecular weight of the copolymer being 1,000 to 200,000, and (B) a photosensitive group bearing resin obtained by the reaction of
  (c) at least one polyepoxide compound having an epoxy equivalent of 75 to 1,000,
  (d) a phenolic hydroxyl group-bearing aromatic or heterocyclic carboxylic acid represented by the formula:

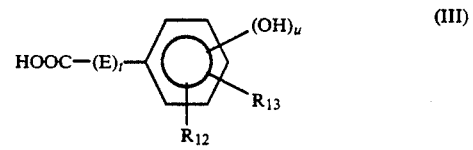

in which E is a substituted or unsubstituted alkylene or arylene, or

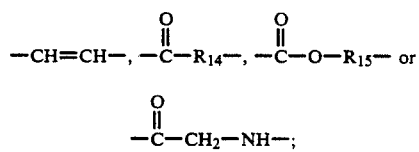

$R_{14}$ and $R_{15}$ each represents a substituted or unsubstituted alkylene or arylene; t is 0 or 1; u is an integer of 1 to 3; $R_{12}$ and $R_{13}$ each represents hydrogen, halogen, alkyl, alkenyl, nitro or alkoxy group, and $R_{12}$ and $R_{13}$, taken together with carbon atoms of the benzene ring may form an aromatic, alicyclic or heterocyclic ring, and (e) 1,2 quinonediazido sulfonic acid halide, in the ratio, in terms of equivalent ratio, of carboxyl group of said (d): epoxy group of said (c)=1:0.8~1.2, and phenolic hydroxyl group of said (d): sulfonyl halide group of said (e)=1:0.05~1.2, the weight ratio of said (A) resin to said (B) resin being 100:3~120. The present invention also provides an image-forming method comprising the combination of steps of forming (a)positive working resist layer(s) on (a)conductive layer(s) on an insulation substrate by the adoption of electrodeposition means with the abovementioned electrodeposition coating composition, thereby forming a composite material coated with (a)positive working resist layer(s), exposing the resist layer(s) through (a) circuit pattern mask(s) closely placed on said layer(s) to an actinic light, thereby forming a latent image of the circuit pattern on the resist layer(s), treating the exposed composite material with an aqueous basic solution to remove the exposed area of said layer(s), subjecting the same to an etching operation to remove the conductive layer(s) located at the exposed areas and finally removing the resist still remaining at the unexposed areas of the resist layer(s).

BEST MODE OF THE INVENTION

The invention has been made on the basis of our novel finding that when the acrylic resin disclosed in said PCT/JP88/00093 is combined with the photosensitive resin disclosed in said PCT/JP88/00094, it surprisingly to gives a positive type photosensitive resin composition which is excellent in storage stability of the photosensitive group, is capable of resulting in a coating, by electrodeposition means on various substrates, with excellent flexibility and adhesion to copper, the coating being free, even in a thin layer, from pinholes and highly sensitive, excellent in alkaline development and affording the least undesired swelling if not exposed at the development stage, and hence specifically useful as a resist in the formation of a fine circuit pattern.

The acrylic resin used as (A) component in the present coating composition is the same type of resins as disclosed in said PCT/JP88/00093. That is, the acrylic resins are advantageously prepared by the copolymerization of (a) 3 to 80% by weight of an acid group bearing long-chain monomer represented by the formula:

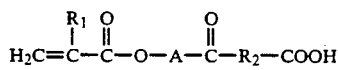  (I)

or the formula:

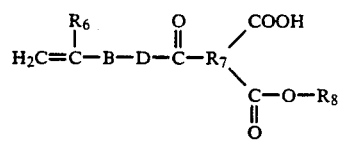  (II)

wherein $R_1$ and $R_6$ each represents hydrogen or methyl; $R_2$ is a substituted or unsubstituted hydrocarbon residue selected from aliphatic hydrocarbons having 2 to 10 carbon atoms, alicyclic hydrocarbons having 6 to 7 carbon atoms and aromatic hydrocarbons having 6 carbon atoms; A is a repeating unit of the formula:

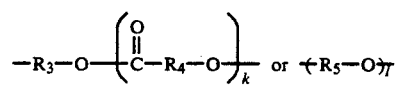

(in which $R_3$ is ethylene or propylene; $R_4$ is a substituted or unsubstituted alkylene having 2 to 7 carbon atoms; $R_5$ is a substituted or unsubstituted alkylene having 2 to 5 carbon atoms; k and l each represents an average repeating unit number and k is 1 to 10 and l is 2 to 50); $R_7$ is a substituted or unsubstituted hydrocarbon residue selected from aliphatic hydrocarbons having 2 to 10 carbon atoms, alicyclic hydrocarbons having 6 to 7 carbon atoms and aromatic hydrocarbons having 6 to 13 carbon atoms; $R_8$ is selected from aliphatic hydrocarbons having 1 to 30 carbon atoms and aromatic hydrocarbons having 6 to 13 carbon atoms whose main chain may include at least one of vinyl group, allyl group, ether group, ester group, carbonyl group, hydroxyl group and combination thereof and whose side chain may include substituents; B is a

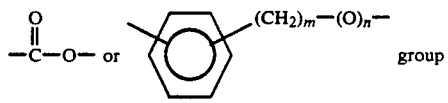 group (in which m and n each is 0 or 1); D is a repeating unit of the formula:

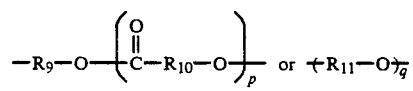

(in which $R_9$ is ethylene or propylene; $R_{10}$ is a substituted or unsubstituted alkylene having 2 to 7 carbon atoms; $R_{11}$ is a substituted or unsubstituted alkylene having 2 to 5 carbon atoms; p and q each is an average repeating unit number and p is 1 to 10 and q is 2 to 50), and (b) 97 to 20% by weight of another copolymerizable $\alpha,\beta$-ethylenically unsaturated compound, weight average molecular weight of the copolymer being 1,000 to 200,000.

The reactive acrylic monomers represented by the formula (I) can be prepared by polymerizing preferably in the presence of a radical polymerization inhibitor, an end hydroxyl group containing (meth)acrylate having the structure:

  (IV)

wherein $R_1$ is hydrogen or methyl group; A is a repeating unit of the formula:

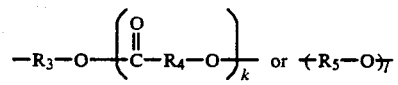

(in which $R_3$ is ethylene or propylene; $R_4$ is a substituted or unsubstituted alkylene having 2 to 7 carbon atoms; $R_5$ is a substituted or unsubstituted alkylene having 2 to 5 carbon atoms; k and l each represents an average repeating unit number and k is 1 to 10 and l is 2 to 50); and an acid anhydride having the formula:

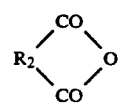  (V)

wherein $R_2$ is a substituted or unsubstituted hydrocarbon residue selected from aliphatic hydrocarbons having 2 to 10 carbon atoms, alicyclic hydrocarbons having 6 to 7 carbon atoms and aromatic hydrocarbons having 6 carbon atoms, as disclosed in Japanese Patent Publication (unexamined) 161742/87.

The reactive acrylic monomer represented by the formula (II) can be advantageously prepared by reacting an end hydroxyl containing (meth) acrylate having the formula:

$$H_2C=\underset{\underset{R_6}{|}}{C}-B-D-H \quad \text{(VI)}$$

wherein $R_6$ is hydrogen or methyl group; B a is $$-\underset{\underset{O}{\|}}{C}-O- \quad \text{or} \quad \text{[benzene ring]}-(CH_2)_m-(O)_n- \text{ group}$$

(in which m and n each is 0 or 1); D is a repeating unit of the formula:

$$-R_9-O-\left(\underset{\underset{O}{\|}}{C}-R_{10}-O\right)_p- \quad \text{or} \quad -(R_{11}-O)_q-$$

(in which $R_9$ is ethylene or propylene; $R_{10}$ is a substituted or unsubstituted alkylene having 2 to 7 carbon atoms; $R_{11}$ is a substituted or unsubstituted alkylene having 2 to 5 carbon atoms; p and q each is an average repeating unit number and p is 1 to 10 and q is 2 to 50), with an acid anhydride having the formula:

$$HOOC-R_7\underset{\underset{CO}{\diagdown}}{\overset{CO}{\diagup}}O \quad \text{(VII)}$$

wherein $R_7$ is a substituted or unsubstituted hydrocarbon residue selected from aliphatic hydrocarbons having 5 to 10 carbon atoms, alicyclic hydrocarbons having 6 to 7 carbon atoms and aromatic hydrocarbons having 6 to 13 carbon atoms to obtain a compound having the formula:

$$H_2C=\underset{\underset{R_6}{|}}{C}-B-D-\underset{\underset{O}{\|}}{C}-R_7\underset{\diagdown COOH}{\diagup COOH} \quad \text{(VIII)}$$

(wherein $R_6$, $R_7$, B and D each has the same meanings as defined above) and further reacting an epoxy compound having the formula:

$$H_2C-\!\!\!-\!\!\!-CH-R_8 \quad \text{(IX)}$$
$$\diagdown O \diagup$$

wherein $R_8$ is selected from aliphatic hydrocarbons having 1 to 30 carbon atoms and aromatic hydrocarbons having 6 to 13 carbon atoms, whose main chain may include at least one of vinyl group, allyl group, ether group, ester group, carbonyl group, hydroxyl group and combination thereof and whose side chain may include substituents, with the abovementioned reaction product (VIII).

The other α,β-ethylenically unsaturated monomers to be copolymerized with thus obtained reactive acrylic monomers having acidic groups and comparatively long side chains may be any of the members customarily used for the preparation of an acrylic resin, which are classified as follows:

(1) acidic group bearing monomers
   (a) α,β-ethylenically unsaturated carboxylic acids as, for example, acrylic acid, methacrylic acid, crotonic acid, itaconic acid, maleic acid, fumaric acid and the like,
   (b) α,β-ethylenically unsaturated sulfonic acids as, for example, 1-acryloxy-1-propanesulfonic acid, 2-acrylamide-2-methyl propanesulfonic acid, 3-methacrylamide-1-hexanesulfonic acid and the like,
   (c) α,β-ethylenically unsaturated phosphoric acids as, for example, acid phosphoxy ethylmethacrylate, acid phosphoxy propyl methacrylate and the like, (2) hydroxy bearing monomers:
   as, for example, 2-hydroxyethyl acrylate, hydroxypropyl acrylate, 2-hydroxyethyl methacrylate, hydroxypropyl methacrylate, hydroxybutyl acrylate, hydroxybutyl methacrylate, allyl alcohol and methallyl alcohol, (3) nitrogen containing alkyl acrylates or methacrylates:
   as, for example, dimethylaminoethyl acrylate, dimethylaminoethyl methacrylate and the like, (4) polymerizable amides:
   as, for example, acrylic amide and methacrylic amide, (5) polymerizable nitriles:
   as, for example, acrylonitrile and methacrylonitrile, (6) alkyl acrylates or methacrylates:
   as, for example, methyl acrylate, methyl methacrylate, ethyl acrylate, ethyl methacrylate, n-butyl acrylate, n-butyl methacrylate, 2-ethylhexyl acrylate and the like, (7) polymerizable aromatic compounds:
   as, for example, styrene, α-methyl styrene, vinyl toluene, t-butyl styrene and the like, (8) alpha-olefines:
   as, for example, ethylene, propylene and the like, (9) vinyl compounds:
   as, for example, vinyl acetate, vinyl propionate and the like,

(10) diene compounds:
   as, for example, butadiene, isoprene and the like.

These monomers are used alone or in combination. The polymerization is carried out in a conventional way. At that time, it is preferred to use a polymerization initiator as, for example, an organic peroxide (e.g. benzoyl peroxide, t-butyl peroxide, cumene hydroperoxide and the like), an organic azo compound (e.g. azobiscyanovaleric acid, azobisisobutyronitrile, azobis(2,4-dimethyl) valeronitrile, azobis(2-amidinopropane) hydrochloride and the like), an inorganic water soluble radical initiator (e.g. potassium persulfate, ammonium persulfate, sodium persulfate, hydrogen peroxide and the like), a Redox type initiator or the like. A chain transfer agent as, for example, a mercaptan (e.g. ethyl mercaptan, butyl mercaptan, dodecyl mercaptan and the like), a halogenated carbon (e.g. carbon tetrabromide, carbon tetrachloride and the like) may also be used as desired. As already stated, the reactive monomer (I) or (II) and other copolymerizable monomers are used in the weight ratio of 3 to 80 parts of the former to 97 to 20 parts of the latter.

Among the latter monomers, for a better control of solubilization speed of the formed resin, at least one of the acid group containing monomers exemplified in said 1) may be preferably copolymerized in an amount of up to 15% by weight. Thus obtained acrylic resin should have a weight average molecular weight of 1,000 to 200,000, preferably 3,000 to 100,000. If the weight average molecular weight exceeds the upper limit of 200,000, the dissolving speed in alkaline developer will become extremely low and excessively longer development time will be required. If the weight average molecular weight is less than 1,000, the solubility speed will become too fast. Both are impractical.

In contrast to heretofore known acrylic resins having comparatively short side chains, the present acrylic resins show better solubilization in alkaline aqueous solution at the same acidic equivalent and result in coatings with improved flexibility. Flexibility and adhesion characteristics are further improved with the combination of said resin with the present photosensitive resin.

The photosensitive resins used in the present invention are the resins disclosed in said PCT /JP88/00094, obtained by the reaction of
(c) at least one polyepoxide compound having an epoxy equivalent of 75 to 1,000,
(d) a phenolic hydroxyl group bearing aromatic or heterocyclic carboxylic acid represented by the formula:

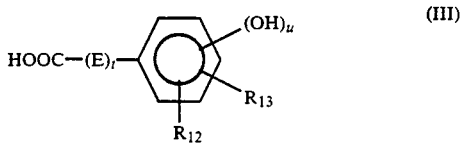

(III)

in which E is a substituted or unsubstituted alkylene or arylene, or

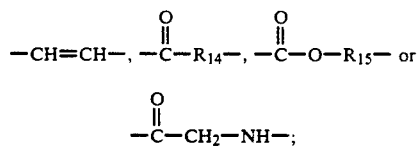

$R_{14}$ and $R_{15}$ each represents a substituted or unsubstituted alkylene or arylene; t is 0 or 1; u is an integer of 1 to 3; $R_{12}$ and $R_{13}$ each represents hydrogen, halogen, alkyl, alkenyl, nitro or alkoxy group, and $R_{12}$ and $R_{13}$, taken together with carbon atoms of the benzene ring may form an aromatic, alicyclic or heterocyclic ring, and
(e) 1,2-quinonediazido sulfonic acid halide, in the ratio, in terms of equivalent ratio, of carboxyl group of said (d): epoxy group of said (c)=1:0.8~1.2, and phenolic hydroxyl group of said (d): sulfonyl halide group of said (e)=1:0.05~1.2.

Such resin can be quite advantageously prepared by either one of the following methods: That is, (c) at least one polyepoxide compound having an epoxy equivalent of 75 to 1000 is reacted with (d) an aromatic or heterocyclic carboxylic acid having phenolic hydroxyl group(s) in an equivalent ratio of carboxyl group of said (c): epoxy group of said (c)=1:0.8 to 1.2, and thereafter, thus obtained product is reacted with (e) 1,2-quinonediazido sulfonic acid halide in an equivalent ratio of phenolic hydroxyl group of said (d): sulfonyl halide group of said (e)=1: 0.05 to 1.2.

Alternatively, said aromatic or heterocyclic carboxylic acid (d) is first reacted with (e) 1,2 quinonediazido sulfonic acid halide and thus obtained product is then reacted with said polyepoxide compound (c) to obtain the same product.

However, from the viewpoint of evading possible decomposition of 1,2-quinonediazido sulfonyl compound under elevated temperature conditions, preference is given to the former method.

As used herein, the term "polyepoxide compound" shall mean polyepoxide compound containing 1.2 or more epoxy groups per molecule.

The polyepoxide compound (c) used in this invention is at least one member selected from the group consisting of glycidyl ethers of polyvalent alcohols, glycidyl esters of polycarboxylic acids, alicyclic glycidyl compounds, glycidyl amine compounds, heterocyclic glycidyl compounds and alkylene oxides compounds of bisphenol-A, having an epoxy equivalent of 75 to 1000, preferably 100 to 350. If the epoxy equivalent is less than 75, the film-forming property of the formed resin is no good and if the epoxy equivalent is more than 1000, the desired photosensitivity may not be obtained and the formed resin will become hardly soluble in an alkaline developer.

More specifically, the following members are advantageously used in this invention:
(a) glycidyl ethers of polyvalent alcohols:
as, for example, polyethyleneglycol diglycidyl ether, polypropyleneglycol diglycidyl ether, neopentylglycol diglycidyl ether, glycerine diglycidyl ether, trimethylolpropane triglycidyl ether, resorcin diglycidyl ether and the like,
(b) glycidyl esters of polycarboxylic acids:
as, for example, phthalic acid diglycidyl ester, tetrahydrophthalic acid diglycidyl ester, adipic acid diglycidyl ester, dimer acid diglycidyl ester and the like,
(c) alicyclic glycidyl compounds:
as, for example, hydrogenated bisphenol-A diglycidyl ether, cyclohexane derivatives, dicyclopentadiene derivatives and the like,
(d) glycidyl amine compounds:
as, for example, tetraglycidyl bisaminomethyl cyclohexane and the like,
(e) heterocyclic glycidyl compounds:
as, for example, triglycidyl isocyanurate, N,N-diglycidyl 5,5-dimethyl hydantoin and the like,
(f) alkylene oxide compounds of bisphenol-A:
as, for example, diglycidyl ether of propylene oxide 2 moles addition product of bisphenol-A and the like.

By the selective use of appropriate polyepoxide compounds, it is possible to obtain a coating with excellent flexibility and adhesion as well as improved resolving power The aromatic or heterocyclic carboxylic acids bearing phenolic hydroxyl groups used in the invention are represented by the formula:

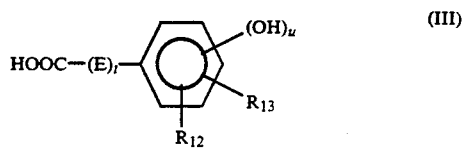

(III)

in which E is a substituted or unsubstituted alkylene or arylene, or

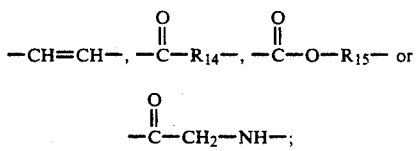

$R_{14}$ and $R_{15}$ each represents a substituted or unsubstituted alkylene or arylene; t is 0 or 1; u is an integer of 1 to 3; $R_{12}$ and $R_{13}$ each represents hydrogen, halogen, alkyl, alkenyl, nitro or alkoxy group, and $R_{12}$ and $R_{13}$, taken together with carbon atoms of the benzene ring may form an aromatic, alicyclic or heterocyclic ring.

Specific examples of such carboxylic acids are 3-methoxy salicylic acid, 3-methyl salicylic acid, 5-t-octyl salicyclic acid, 3-chloro-4-hydroxy benzoic acid, 5-fluoro-3-hydroxy benzoic acid, 4-methyl thio-salicyclic acid, 3-hydroxy-4-nitrobenzoic acid, 3,5-dimethyl-4-hydroxy benzoic acid, 3,5-di-t-butyl-4-hydroxy benzoic acid, 3-phenyl salicylic acid, 4-benzamido-salicyclic acid, 4-dimethylamino salicylic acid, 3,4-dihydroxy benzoic acid, 2,3-dihydroxy benzoic acid, 2,6-dihydroxy benzoic acid, 4-bromo-3,5-dihydroxy benzoic acid, 3,4,5-trihydroxy benzoic acid, 2,4,6-trihydroxy benzoic acid, dibromo gallic acid, o-hydroxyphenyl acetic acid, m-hydroxyphenyl acetic acid, p-hydroxyphenyl acetic acid, 4-hydroxy-3-methoxy phenyl acetic acid, dl-4-hydroxy-3-methoxy mandelic acid, p-hydroxyphenyl pyruvic acid, 3-(p-hydroxyphenyl)-lactic acid, dl-3,4-dihydroxy mandelic acid, 3,4-dihydroxyphenyl acetic acid, o-hydroxy cinnamic acid, m-hydroxy cinnamic acid, p-hydroxy cinnamic acid, 3-hydroxy-4-methoxy cinnamic acid, 3,4-dihydroxy cinnamic acid, 3,5-dimethoxy-4-hydroxy cinnamic acid, 3,4-dihydroxy hydrocinnamic acid, N-(p-hydroxyphenyl)glycine, 3,5-di-iodothiocyne, homogentisic acid and the like.

However, the carboxylic acids of the present invention are not limited to the abovementioned compounds, and any aromatic or heterocyclic carboxylic acids bearing phenolic hydroxyl groups, represented by the abovementioned formula may be advantageously used for the purpose of this invention. Said polyepoxide compound and said carboxylic acid are reacted in an equivalent ratio of carboxyl groups: epoxy groups = 1:0.8 ~ 1.2, preferably 1:0.9 ~ 1.1, usually in a solvent and in the presence of a catalyst at 50° to 180° C., preferably 80° to 150° C. As a solvent, a member such as dioxane, methyl isobutyl ketone, tetrahydrofuran, methyl ethyl ketone and the like is used in an appropriate amount as, for example, 50 to 500 parts per 100 parts total solid by weight.

As the catalyst, any members heretofore known for the reaction between epoxy group and carboxyl group may be satisfactorily used. Examples are inorganic alkali as potassium hydroxide, sodium hydroxide and the like; quaternary ammonium salts as triethylbenzyl ammonium chloride, tetramethyl ammonium chloride and the like; tertiary amines as benzyl methyl amine, tributyl amine, tris(dimethylamino) methyl phenol and the like; and imidazole compounds as 2-methyl-4-ethyl imidazole, 2-methyl imidazole and the like. Such catalyst is used in a conventional catalytic amount as, for example, 0.01 to 5% by weight. However, as already stated, in the present invention, it is essential that an equivalent ratio of carboxyl to epoxy groups be selected in a range of 1:0.8 to 1:1.2. If the proportion of epoxy groups is less than 0.8 per 1 equivalent carboxyl, a larger amount of free carboxyl groups will remain in the final resin. This is undesirable because the formed resin is excessively soluble in an alkaline solution and developing properties will be adversely affected therewith. If the proportion of epoxy groups exceeds the upper limit of 1.2 per 1 equivalent carboxyl, there occurs crosslinking of polyepoxy compounds, resulting in a resin which is hardly soluble in an alkaline solution. Developing properties are likewise affected adversely.

In this invention, 1,2-quinonediazido sulfonic acid halide as, for example, 1,2-naphthoquinonediazido-4-sulfonyl chloride, 1,2-naphthoquinonediazido-5-sulfonyl chloride, 1,2-benzoquinonediazido-4-sulfonyl chloride and the like is then reacted with the abovementioned reaction product of the polyepoxide compound and the aromatic or heterocyclic carboxylic acid, in the proportion, in terms of equivalent ratio, of phenolic hydroxyl group : sulfonyl halide group = 1:0.05 ~ 1.2, preferably 1:0.1 ~ 1.0. This reaction is favorably effected in an appropriate solvent as dioxane, acetone, tetrahydrofuran, methyl ethyl ketone and in the presence of a catalyst known to be useful for the reaction between hydroxyl group and sulfonyl halide group, as, for example, inorganic alkali like sodium carbonate, sodium hydroxide and the like and organic amines as diethylamine, triethylamine and the like, at −20° to 50° C., preferably −10° to 30° C. The reaction conditions may be varied depending on the starting materials used, however, low temperature condition is desired from the standpoint of thermal stability of 1,2-naphthoquinonediazido compound used.

The equivalent ratio of phenolic hydroxyl group to sulfonyl halide group must be in a range abovementioned. This is because, if the proportion of sulfonyl halide group is less than 0.05 equivalent per 1 equivalent phenolic hydroxyl, there is a shortage of quinonediazido content in the final resin and when the formed resin is exposed to light and decomposed, desired alkali solubility cannot be obtained. Whereas, if the proportion of sulfonyl halide is more than 1.2 equivalent per 1 equivalent phenolic hydroxyl, there will remain a quantity of low molecular quinonediazido compounds in the final resin as impurities and desired clear image will not be obtained. Furthermore, there results a considerable fluctuation in film properties, which are not desired.

The present photosensitive resin may also be prepared by first reacting an aromatic or heterocyclic carboxylic acid bearing phenolic hydroxyl groups with 1,2-quinonediazido sulfonic acid halide in a similar way as previously mentioned and then reacting with polyepoxide compound. However, from the viewpoint of thermal stability of 1,2-quinonediazido compound, much preference is given to the former method than the latter.

The present photosensitive resin per se has an excellent film-forming property and can result in a coating with excellent flexibility and adhesion properties. By the selection of appropriate polyepoxide compound depending on the composition of acid group bearing acrylic resin component, excellent compatibility of the photosensitive resin with the acrylic resin can be obtained.

Since the present acrylic resin has at least one long side chain and free carboxyl group, this resin can be used, after being partially or completely neutralized with a basic compound, as binder resin in an electrodeposition bath. The inventors have surprisingly found that when the resin in its neutralized form is compounded with a quinonediazido bearing resin and thus obtained mixture is dispersed in an aqueous medium, the dispersed particles are very stable in the medium and deleterious change of photosensitivity can be effectively controlled. The reasons have not been completely determined but the following are believed to be the reasons therefor up to the present day.

Since the resins are compatible with each other and salt groups of binder resin are located on a long flexible side chain and at a long distance from the main chain thereof, hydrophobic quinonediazido portion is prone to locate at the inside of the combined resinous particle and hydrophilic salt forming portion at the outside of said particle, this particular structure contributing to the stability of dispersed resin particle in an aqueous medium and to the control of deleterious change of photosensitivity owing to the decomposition or coupling of the quinonediazido portion in a basic compound/water atmosphere.

The present electrodeposition coating composition for a positive working resist comprises as essential components (A) the abovementioned acid group containing acrylic resin, and (B) the abovementioned photosensitive group bearing resin in the weight ratio of $(A)/(B)=100/3 \sim 120$, preferably $(A)/(B)=100/5 \sim 100$.

If the (B) resin content is less than 3 parts by weight per 100 parts of said (A) resin, the resulted coating can not be used as an effective positive working resist, because there is no significant difference in solubility for alkaline developer between the exposed area and unexposed area of the coating. If the (B) resin content exceeds the upper limit of 120 parts by weight, there results an aqueous dispersion of less storage stability and precipitates will appear with time.

For making an aqueous dispersion or solution, the carboxylic groups contained in the acrylic resin must be neutralized with a basic material.

Examples of such basic materials are alkanol amines as monoethanol amine, diethanol amine, triethanol amine and the like; alkylamines as monoethyl amine, diethyl amine, triethyl amine and the like; alkyl alkanol amines as dimethylaminoethanol and the like; alkali metal hydroxides as sodium hydroxide, potassium hydroxide and the like; and ammonia. They are used each singularly or in combination of 2 or more.

The amount of said basic material is preferably determined in a range of 0.3 to 1.0 equivalent per equivalent carboxyl group in the acrylic resin. If the proportion of basic material is less than 0.3 equivalent, there is an undesirable loss in aqueous dispersion stability and precipitates will appear with time. If the basic material exceeds the upper limit of 1.0 equivalent, there is a tendency that stability of the quinonediazido group will be lost and the aqueous dispersion will be colored with time.

In preparing the present electrodeposition coating composition, the acid group bearing acrylic resin (A), photosensitive resin (B), neutralization basic material and other optional ingredients are first dissolved in an appropriate organic solvent and the solution is diluted with water. If desired, the present composition may further contain an organic solvent, pigment and dyestuff, defoaming agent, surfactant or the like.

The present electrodeposition coating composition may be applied on any substrates providing the have a conductive coating thereon, by electrodeposition means. Particularily useful is a copper base plate having many mini-via-holes for a printed circuit board.

In carrying out an electrodeposition coating with the abovementioned coating composition, the electrodeposition bath is controlled in a solid content of 3 to 40%, preferably 5 to 25%, at a temperature of 10° to 40° C., preferably 15° to 35° C. A substrate having an appropriate conductive layer is dipped into the bath, the substrate coated with a conductive layer is connected to an anode and the bath wall to a cathode and a direct current is applied to the electrodes until the coating with desired thickness is obtained. The electrodeposited plate is then washed with water and dried in a conventional way to obtain a plate with a satisfactory positive working resist. The coating obtained has no pinholes, has a uniform thickness and the walls of through-holes are perfectly covered therewith. Thermal drying is usually carried out at 40° to 150° C., preferably 60° to 130° C. If the temperature is less than 40° C., even though the desired drying is obtained in a long drying time, it is unable to restore the pinholes resulted from the generation of gas by an electrode reaction. If the temperature exceeds 150° C., there is a tendency that the quinonediazido group is liable to be decomposed.

In carrying out the present image-forming method, a positive pattern film (circuit pattern mask) is placed on thus formed positive working resist and the composite is exposed to an actinic light. The mask is then removed off, and the remaining resist is developed with an aqueous alkaline solution. At that time, the exposed resist is dissolved out, because of photodecomposition of the quinonediazido group, and unexposed resist remains in its original place, resulting in an effective etching resist pattern.

The light source used may be any actinic light having a wave-length band of 300 to 450 nm. Examples are high-pressure mercury lamp, super high-pressure mercury lamp, metal halide lamp, xenon lamp, arc lamp and the like.

The development may be easily carried out with a conventional weak alkaline aqueous solution, by dipping, spraying, brushing and the like. Examples of developers are aqueous solutions of such alkaline materials as inorganic alkali like sodium carbonate, sodium silicate, sodium metasilicate, trisodium phosphate, sodium hydroxide, potassium hydroxide and the like; organic amines like n-propylamine, di-n-propylamine, pyrrol, piperidine, piperazine, triethylenediamine, dimethylethanolamine, triethanolamine, diethylhydroxylamine and the like; quaternary ammonium salts like tetramethyl ammonium hydroxide, tetraethylammonium hydroxide and the like; and ammonia. If desired, other additives as water soluble organic solvent, surfactant, defoaming agent and the like may be added to the developer. Next, the plate with a circuit resist pattern is subjected to an etching operation in a conventional way and the exposed conductive layer is etched and removed.

As an etching solution, ferric chloride, cupric chloride and the like may be satisfactorily used. At that time, inside surfaces of mini-via-holes, if any, may be effectively and safely protected by the said etching resist.

Finally, the unexposed resist still remaining on the conductive layer is removed off by the treatment with a strong alkaline aqueous solution as sodium hydroxide, potassium hydroxide and the like and the desired copper circuit pattern is obtained. The present electrodeposition coating composition is excellent in storage stability, shows excellent coverage for uneven surfaces, and is capable of resulting in a non-tacky, smooth and uniform resist coating. The positive working resist obtained is specifically useful for the preparation of a highly dense, fine circuit pattern board.

Particularly useful electrodeposition coating compositions are as follows:

A composition above, wherein $R_2$ of the formula (I) is an aromatic hydrocarbon.

A composition above, wherein $R_7$ of the formula (II) is an aromatic hydrocarbon having 6 to 13 carbon atoms and B is

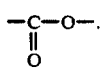

A composition above, wherein t of the formula (III) is 0.

The present invention shall be now more fully explained in the following Examples. Unless otherwise stated, all parts and percentages are by weight.

SYNTHETIC EXAMPLE 1

Into a 1 liter glass flask fitted with a stirrer, a Dimroth condenser, a thermometer and an air inlet tube, were placed 207.2 parts of phthalic anhydride, 501.2 parts of Placcel FM-2 (2:1 mol adduct of ε-caprolactone and 2-hydroxyethyl methacrylate, trademark of Daicel Chem. Co.) and 500 ppm to the total charged amount of hydroquinone monometyl ether. While introducing air, the mixture was reacted under stirring at 150° C. (inner temperature) for 1 hour.

After completion of the reaction, the mixture was allowed to cool to a room temperature and filtered to obtain the desired reactive acrylic monomer (I), whose acid value was 114. The reaction percentage calculated from the measured acid value was 97%.

Into a 1 liter glass flask fitted with a stirrer, a Dimroth condenser, a thermometer, a dropping funnel and a nitrogen gas inlet tube, were placed beforehand 300 parts of ethylene glycol monobutyl ether. Then, the mixture of 140 parts of the reactive acrylic monomer (I), 130 parts of methyl methacrylate, 130 parts of n-butyl acrylate and 10 parts of t-butyl peroxy-2-ethyl hexanoate as a polymerization initiator was drop-wise added to the solution through the dropping funnel under stirring at 120° C. for 3 hours, and the mixture was further maintained at 120° C. for 2 hours to obtain an acrylic resin composition. The acid value of the resultant resin product was 39.9 and the weight average molecular weight was 30,000.

SYNTHETIC EXAMPLE 2

Into a similar reaction vessel as used in Synthetic Example 1, were placed 148 parts of phthalic anhydride, 400 parts of Blenmer PP-10000 (5.5:1 mol addition product of propylene oxide and methacrylic acid, trademark of Nippon Yushi), and 500 ppm to the total charged amount of hydroquinone monomethyl ether. While introducing air, the mixture was reacted, under stirring, at 150° C. (inner temperature) for 60 minutes.

Thus obtained reactive acrylic monomer (2) had an acid value of 108 and a viscosity (25° C.) of 300 cp. The reaction percentage was 95%.

Following the procedures stated in Synthetic Example 1, an acrylic resin composition was prepared by employing the following formulation:

| | |
|---|---|
| monomer (2) | 75 parts |
| methyl methacrylate | 75 parts |
| n-butyl acrylate | 50 parts |
| acrylonitrile | 25 parts |
| t-butyl peroxy-2-ethyl hexanoate | 4.5 parts |
| ethylene glycol monobutyl ether | 180 parts |

Thus obtained reaction product had an acid value of 40.2 and a weight average molecular weight of 32,000.

SYNTHETIC EXAMPLE 3

Into a similar reaction vessel as used in Synthetic Example 1, were placed 77 parts of trimellitic anhydride, 300 parts of Placcel FM-5 (5:1 mol addition product of ε-caprolactone and 2-hydroxyethyl methacrylate, trademark of Daicel Chem. Co.) and 500 ppm to the total charged amount of hydroquinone monomethyl ether. While introducing air, the mixture was stirred at 165° C. for 30 minutes to promote the reaction.

Thereafter the reaction mixture was subjected to a hot filtration to remove a small quantity of unreacted materials. Thus obtained intermediate product had an acid value of 125 and was a semi-solid product at 25° C.

Then, 100 parts of Cardura E-10 (glycidyl versatate, trademark of Shell Chemical Co.) were added to the intermediate product obtained by the abovesaid preparation procedure. While introducing air again, the mixture was stirred at 150° C. (inner temperature) for 40 minutes to promote the reaction.

Thus obtained reactive acrylic monomer (3) had an acid value of 52 and a viscosity of 400 cp (25° C.). The reaction percentage determined from the acid value was found to be 95%. Following the procedures stated in Synthetic Example 1, an acrylic resin composition was prepared by employing the following formulation:

| | |
|---|---|
| monomer [3] | 77.0 parts |
| methacrylic acid | 9.3 parts |
| methyl methacrylate | 80.0 parts |
| n-butyl acrylate | 33.7 parts |
| t-butyl peroxy-2-ethyl hexanoate | 4.0 parts |
| ethyleneglycol monobutyl ether | 164.0 parts |

Thus obtained reaction product had an acid value of 40.5 and a weight average molecular weight of 27,000.

SYNTHETIC EXAMPLE 4

The same procedures as stated in Synthetic Example 1 were repeated using the following:

| | |
|---|---|
| Reactive acrylic monomer (3) | 77 parts |
| methacrylic acid | 6.2 parts |
| methyl methacrylate | 79.5 parts |
| n-butyl methacrylate | 36.8 parts |
| Phosmer PP | 0.5 parts |
| (acid phosphoxy polyoxypropylene glycol monomethacrylate, propylene oxide 5 ~ 6 mols) | |
| t-butyl peroxy 2-ethyl hexanoate | 6 parts |
| propylene glycol monopropyl ether | 130 parts |

Weight average molecular weight of the resin was 16,000 and acid value was 40.3.

SYNTHETIC EXAMPLE 5

Into a 1 liter glass reaction flask fitted with a stirrer, a reflux condenser and thermometer, were placed 100 parts of polyethyleneglycol diglycidyl ether (epoxy equivalent 192.5), 71.8 parts of salicylic acid and 28 parts of ethyleneglycol monoethyl ether acetate and the inner temperature was raised to 120° C.

After adding 0.5 part of benzyl dimethylamine (catalyst), the combined was reacted for 6 hours. The acid value of the reaction mixture was 5.6, which indicated the reaction percentage of 96.2%.

Then, the mixture was allowed to cool to 10° C., added with 105 parts of 1,2-naphthaquinonediazido-5-sulfonyl chloride and 160 parts of dioxane, and the resulted solution was added drop-wise with 43.5 parts of triethyl amine, and further stirred for 2 hours. The reaction mixture was then poured into a quantity of 2% (by weight) hydrochloride acid solution and the formed precipitates were collected, washed with water and dried at 40° C. for 15 hours in vaccuo, to obtain a positive type photosensitive resin.

The reaction yield was 93%.

SYNTHETIC EXAMPLE 6

Into a similar reaction vessel as used in Synthetic Example 5, were placed 88 parts of phthalic diglycidyl ester (epoxy equivalent 175), 85 parts of 3,4-dihydroxy acetic acid and 58 parts of dioxane. The mixture was heated to 120° C., added with 1.5 parts of thimethyl ammonium chloride as a catalyser and thereafter reacted at 120° C. for 5 hours. The acid value of the reaction solution was 7.0 and the reaction rate was 95.7%.

Then the mixture was allowed to cool to 10° C., added with 250 parts of 1,2-naphthoquinondiazido-5-sulfonyl chloride and 400 parts of acetone. The mixture was reacted while drop-wise adding 60 parts of triethyl amine as a catalyser at 10° C. for 2 hours. Thereafter the reaction mixture was drop-wise added to a large quantity of 2% diluted aqueous hydrochloric acid solution to obtain a resinous precipitate. After being washed with water, the precipitate was subjected to vacuum drying at 40° C. for 20 hours to obtain a positive type photosensitive resin.

The reaction yield was 90%.

SYNTHETIC EXAMPLE 7

Into a similar reaction vessel as used in Synthetic Example 5, were placed 110 parts of hydrogenated bisphenol-A diglycidyl ether (epoxy equivalent 220), 97 parts of 3-hydroxy-4-cinnamic acid and 69 parts of dioxane. The mixture was heated to 120° C., added with 1.5 parts of trimethyl ammonium chloride as a catalyser and thereafter reacted at 120° C. for 5 hours. The acid value of the reaction solution was 6.0 and the reaction rate was 95.6%.

Then the mixture was allowed to cool to 10° C., added with 135 parts of 1,2-naphthoquinondiazido-4-sulfonyl chloride and 500 parts of acetone. The mixture was reacted while drop-wise adding 60 parts of triethyl amine as a catalyser at 10° C. for 2 hours. Thereafter the reaction mixture was drop-wise added to a large quantity of 2% diluted aqueous hydrochloric acid solution to obtain a resinous precipitate. After being washed with water, the precipitate was subjected to vacuum drying at 40° C. for 20 hours to obtain a positive type photosensitive resin.

The reaction yield was 92%.

SYNTHETIC EXAMPLE 8

Into a similar reaction vessel as used in Synthetic Example 5, were placed 67 parts of 2:1 mol adduct of bisphenol-A propylene oxide and diglycidyl ether (epoxy equivalent 315), 33 parts of 3,4-dihydroxy benzoic acid and 33 parts of dioxane. The mixture was heated to 120° C., added with 1.2 parts of trimethyl ammonium chloride as a catalyser and thereafter reacted at 120° C. for 5 hours. The acid value of the reaction solution was 5.0 and the reaction rate was 94.4%.

Then the mixture was allowed to cool to 10° C., added with 114 parts of 1,2-naphthoquinondiazido-4-sulfonyl chloride and 550 parts of acetone. The mixture was reacted while drop-wise adding 51 parts of triethyl amine as a catalyser at 10° C. for 2 hours. Thereafter the reaction mixture was drop-wise added to a large quantity of 2% diluted aqueous hydrochloric acid solution to obtain a resinous precipitate. After being washed with water, the precipitate was subjected to vacuum drying at 40° C. for 20 hours to obtain a positive type photosensitive resin.

The reaction yield was 95%.

SYNTHETIC EXAMPLE 9

Into a similar reaction vessel as used in Synthetic Example 5, were placed 67 parts of trimethylol propane triglycidyl ether (epoxy equivalent 150), 71 parts of 3-methyl salicylic acid and 46 parts of ethylene glycol monobutyl ether acetate. The mixture was heated to 120° C., added with 1.3 parts of trimethyl ammonium chloride as a catalyser and thereafter reacted at 120° C. for 5 hours. The acid value of the reaction solution was 5.5 and the reaction rate was 96.6%. Then the mixture was allowed to cool to 10° C., added with 87.5 parts of 1,2-naphthoquinondiazido-5-sulfonyl chloride and 600 parts of acetone. To the mixture was further added drop-wise 40 parts of triethyl amine as a catalyser and reacted at 10° C. for 2 hours. Thereafter the reaction mixture was drop-wise added to a large quantity of 2% diluted aqueous hydrochloric acid solution to obtain a resinous precipitate. After being washed with water, the precipitate was subjected to vacuum drying at 40° C. for 18 hours to obtain a positive type photosensitive resin.

The reaction yield was 95%.

EXAMPLE 1

To 140 parts of acrylic resin varnish obtained in Synthetic Example 1, a solution of 20 parts of positive type photosensitive resin prepared in Synthetic Example 5 in 20 parts of propyleneglycol monomethyl ether was added. Then, 4.6 parts of triethylamine were added to neutralize the carboxylic groups contained in said acrylic resin.

While stirring, 815.4 parts of deionized water were gradually added to obtain an electrodeposition coating composition. In this experiment, a two-sided circuit base plate comprising an insulation plate having mini-via-holes (0.3 mm diameter) previously coated with copper in a thickness of 43 $\mu$m by electroless plating and electroplating was used.

The said base plate was dipped in the abovementioned electrodeposition coating composition bath, the base plate was connected to an anode, the metallic bath container to a cathode, and a direct current of 50 mA/dm$^2$ was applied between the electrodes at 25° C. for 2 minutes.

The plate was then washed with water and dried in an oven at 100° C. for 5 minutes to form a positive type photosensitive resin coating of 7 $\mu$ thickness. This coating had no pinholes, had a uniform coating thickness and the inside walls of the through-holes were perfectly covered.

The resist properties of thus formed coating and storage stability of the electrodeposition coating composition were tested and evaluated as follows:

1. Pinhole test:

One surface of thus formed resist coatings was exposed to ultraviolet rays with light intensity of 3.5 mW/cm$^2$ at 365 nm for 1 minute. Then, the exposed plate was developed with 1.5% aqueous solution of sodium metasilicate at 30° C. for 1 minute and subsequently etched with a ferric chloride solution until the exposed copper coating was thoroughly removed off. Thereafter, corrosion on the remaining copper surface due to pinholes was checked. In this experiment, no corrosion was observed.

2. Resolving power test:

A positive film mask having line-and-space (L/S) pattern with each 10 μm increasing unit steps from 30 μm to 100 μm was closely placed on the resist coating, exposed to ultraviolet rays with light intensity of 3.5 mW/cm$^2$ at 365 nm for 1 minute and developed with 1.5% aqueous sodium metasilicate solution at 30° C. for 1 minute. The smallest line width pattern having no development residue was checked and found to be 30 μm L/S.

3. Conductivity test:

A set of circuit pattern masks were closely placed on the resist coatings and both surfaces were exposed to ultraviolet rays with light intensity of 3.5 mW/cm$^2$ at 365 nm for 1 minute and developed with 1.5% aqueous sodium metasilicate solution at 30° C. for 1 minute. Thereafter, exposed copper was etched with a ferric chloride solution and thus treated plate was washed with water and then treated with 3% aqueous potassium hydroxide solution at 50° C. to remove the remaining resist on the circuit pattern. Electric conductivity at the circuit points on both surfaces was measured by using a tester. Excellent conductivity was found on every circuit point.

4. Composition stability test:

The abovementioned electrodeposition coating composition was stationarily stored at room temperature for 2 months. There were only slight changes in pH and in conductance. No adverse effects were observed when the stored composition was used in the electrodeposition coating.

EXAMPLES 2 TO 6

Various electrodeposition coating compositions were prepared as in Example 1 with the materials shown in Table 1 and evaluated as in Example 1. The test results are shown in the same Table.

TABLE 1

| Example | 2 | 3 | 4 | 5 | 6 |
|---|---|---|---|---|---|
| acrylic resin | Syn. Ex. 2 | Syn. Ex. 3 | Syn. Ex. 3 | Syn. Ex. 4 | Syn. Ex. 4 |
| (amount) | (144) | (164) | (155) | (131) | (107) |
| positive type resin | Syn. Ex. 6 | Syn. Ex. 7 | Syn. Ex. 8 | Syn. Ex. 9 | Syn. Ex. 9 |
| (amount) | (20) | (10) | (15) | (20) | (35) |
| propyleneglycol monomethylether (amount) | (20) | (10) | (15) | (20) | (35) |
| other solvent (amount) | — | — | methylethyl ketone | — | — |

TABLE 1-continued

| Example | 2 | 3 | 4 | 5 | 6 |
|---|---|---|---|---|---|
| triethylamine (amount) | (4.6) | (4.5) | (15) (4.3) | (3.6) | (3.7) |
| deionized water (amount) | (811.4) | (811.5) | (795.7) | (825.4) | (819.3) |
| current supplying time (sec.) at 50 mA/dm$^2$ | 120 | 120 | 100 | 110 | 90 |
| pinholes | good | good | good | good | good |
| resolving power test L/S (μm) | 30 | 40 | 30 | 30 | 30 |
| conductivity test | all points excellent | all points excellent | all points excellent | all points excellent | all points excellent |
| storage stability | no change 2 months | no change 3 months | no change 3 months | no change 3 months | no change 2 months |

What is claimed is:

1. An image-forming method comprising the combination of steps of providing an aqueous electrodeposition coating composition for a positive working resist comprising (A) an acrylic resin obtained by the copolymerization of
(a) 3 to 80% by weight of an acid group bearing long-chain monomer represented by the formula:

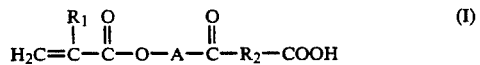

or the formula:

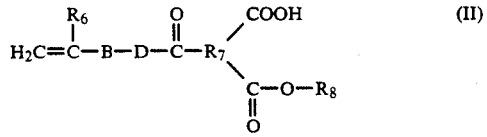

wherein $R_1$ and $R_6$ each represents hydrogen or methyl; $R_2$ is a substituted or unsubstituted hydrocarbon residue selected from aliphatic hydrocarbons having 2 to 10 carbon atoms, alicyclic hydrocarbons having 6 to 7 carbon atoms or aromatic hydrocarbons having 6 carbon atoms; A is a repeating unit of the formula:

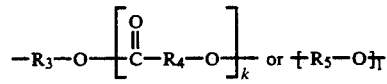

in which $R_3$ is ethylene or propylene; $R_4$ is a substituted or unsubstituted alkylene having 2 to 7 carbon atoms; $R_5$ is a substituted or unsubstituted alkylene having 2 to 5 carbon atoms; k and l each represents an average repeating unit number and k is 1 to 10 and l is 2 to 50; $R_7$ is a substituted or unsubstituted hydrocarbon residue selected from aliphatic hydrocarbons having 5 to 10 carbon atoms, alicyclic hydrocarbons having 6 to 7 carbon atoms or aromatic hydrocarbons having 6 to 13 carbon atoms; $R_8$ is selected from aliphatic hydrocarbons having 1 to 30 carbon atoms or aromatic hydrocarbons having 6 to 13 carbon atoms whose main chain may include at least one of vinyl group, allyl group, ether group, ester group, carbonyl group, hydroxyl group or combination thereof and whose side chain may include substituents; B is a

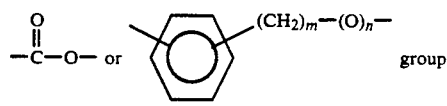
group in which m and n each is 0 or 1; D is a repeating unit of the formula:

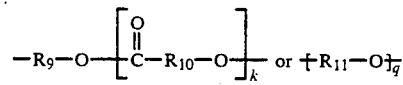

in which $R_9$ is ethylene or propylene; $R_{10}$ is a substituted or unsubstituted alkylene having 2 to 7 carbon atoms; $R_{11}$ is a substituted or unsubstituted alkylene having 2 to 5 carbon atoms; p and q each is an average repeating unit number and p is 1 to 10 and q is 2 to 50, and (b) 97 to 20% by weight of another copolymerizable α,β-ethylenically unsaturated compound, weight average molecular weight of the said copolymer being 1,000 to 200,000, and (B) a photosensitive group bearing resin obtained by the reaction of (c) at least one polyepoxide compound having an epoxy equivalent of 75 to 1,000, (d) aromatic or heterocyclic carboxylic acid bearing phenolic hydroxyl groups represented by the formula:

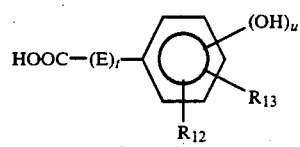 (III)

in which E is a substituted or unsubstituted alkylene or arylene, or

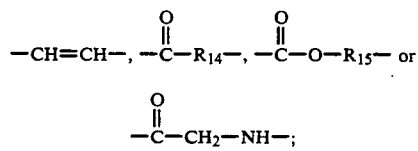

$R_{14}$ and $R_{15}$ each represents a substituted or unsubstituted alkylene or arylene; t is 0 or 1; u is an integer of 1 to 3; $R_{12}$ and $R_{13}$ each represent hydrogen, halogen, alkyl, alkenyl, nitro or alkoxy group, and $R_{12}$ and $R_{13}$, taken together with carbon atoms of the benzene ring may form an aromatic, alicyclic or heterocyclic ring, and (e) 1,2-quinonediazido sulfonic acid halide, in a ratio, in terms of equivalent ratio, of carboxyl group of said (d): epoxy group of said (c)=1:0.8~1.2 and phenolic hydroxyl group of said (d): sulfonyl halide group of said (e)=1:0.5~1.2, the weight ratio of said (A) resin to said (B) resin being 100:3~120, forming (a) positive working resist layer(s) on (a) conductive layer(s) on an insulated substrate by the adoption of electrodeposition means with the electrodeposition coating composition, thereby forming a composite material coated with (a) positive working resist layer(s), exposing the resist layer(s) through (a) circuit pattern mask(s) closely placed on said layer(s) to an actinic light, thereby forming a latent image of the circuit pattern on the resist layer(s), treating the exposed composite material with an aqueous basic solution to remove the exposed areas of said layer(s), subjecting the same to an etching operation to remove the conductive layer(s) located at the exposed areas, and removing the resist still remaining at the unexposed areas of the resist layer(s).

* * * * *